United States Patent
Mandell et al.

(10) Patent No.: US 7,199,394 B2
(45) Date of Patent: Apr. 3, 2007

(54) POLYMER MEMORY DEVICE WITH VARIABLE PERIOD OF RETENTION TIME

(75) Inventors: Aaron Mandell, Boston, MA (US); Michael A VanBuskirk, Saratoga, CA (US); Stuart Spitzer, Lynnfield, MA (US); Juri H Krieger, Brookline, MA (US)

(73) Assignee: Spansion LLC, Sunnyvale, CA (US)

( * ) Notice: Subject to any disclaimer, the term of this patent is extended or adjusted under 35 U.S.C. 154(b) by 86 days.

(21) Appl. No.: 10/919,572

(22) Filed: Aug. 17, 2004

(65) Prior Publication Data
US 2006/0038169 A1    Feb. 23, 2006

(51) Int. Cl.
    H01L 29/08    (2006.01)
    H01L 23/58    (2006.01)
(52) U.S. Cl. .................. 257/40; 257/642; 257/798
(58) Field of Classification Search .......... 257/40, 257/642, E51.001, E51.002, 798, E39.007, 257/E51.02
    See application file for complete search history.

(56) References Cited

U.S. PATENT DOCUMENTS 6,656,763 B1    12/2003    Oblesby et al.

2003/0053350 A1 *    3/2003    Krieger et al. .............. 365/200
2003/0173612 A1 *    9/2003    Krieger et al. .............. 257/304
2004/0102038 A1    5/2004    Oblesby et al.

OTHER PUBLICATIONS

International Search Report dated Dec. 14, 2005 mailed Dec. 21, 2005 for PCT Application Serial No. PCT/US2005/028339, 3 Pages.
International Search Report dated Jan. 13, 2006 and mailed Feb. 21, 2006 for PCT Application Serial No. 2005/028339, 8 pages.

* cited by examiner

*Primary Examiner*—Long K. Tran
(74) *Attorney, Agent, or Firm*—Amin, Turocy, & Calvin, LLP

(57) ABSTRACT

Systems and methodologies are provided for of enabling a polymer memory cell to exhibit variable retention times for stored data therein. Such setting of retention time can depend upon a programming mode and/or type of material employed in the polymer memory cell. Short retention times can be obtained by programming the polymer memory cell via a low current or a low electrical field. Similarly, long retention times can be obtained by employing a high current or electrical field to program the polymer memory cell.

18 Claims, 11 Drawing Sheets

SHORT RETENTION

LONG RETENTION

US 7,199,394 B2

POLYMER MEMORY DEVICE WITH VARIABLE PERIOD OF RETENTION TIME

TECHNICAL FIELD

The present invention relates generally to memory cells, and in particular to polymer memory cells that exhibit a variable length retention time for data stored therein, based on their layering structure and/or programming scheme.

BACKGROUND OF THE INVENTION

The proliferation and increased usage of portable computer and electronic devices has greatly increased demand for memory cells. Digital cameras, digital audio players, personal digital assistants, and the like generally seek to employ large capacity memory cells (e.g., flash memory, smart media, compact flash, or the like). Memory cells can be typically employed in various types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices which are often, but not always, short term storage mediums.

Also, memory cells can generally be subdivided into volatile and non-volatile types. Volatile memory cells usually lose their information if they lose power and typically require periodic refresh cycles to maintain their information. Volatile memory cells include, for example, random access memory (RAM), DRAM, SRAM and the like. Non-volatile memory cells maintain their information whether or not power is maintained to the devices. Examples of non-volatile memory cells include; ROM, programmable read only memory (PROM), erasable programmable read only memory (EPROM), electrically erasable programmable read only memory (EEPROM), flash EEPROM the like. Volatile memory cells generally provide faster operation at a lower cost as compared to non-volatile memory cells. Nonetheless, to retain the information, the stored data typically must be refreshed; that is, each capacitor must be periodically charged or discharged to maintain the capacitor's charged or discharged state. The maximum time allowable between refresh operations depends on the charge storage capabilities of the capacitors that make up the memory cells in the array. The memory device manufacturer typically specifies a refresh time that guarantees data retention in the memory cells.

As such, each memory cell in a memory device can be accessed or "read", "written", and "erased" with information. The memory cells maintain information in an "off" or an "on" state (e.g., are limited to 2 states), also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with inorganic solid state technology, such as, crystalline silicon devices. A common semiconductor device employed in memory devices is the metal oxide semiconductor field effect transistor (MOSFET).

Because of the increasing demand for information storage, memory device developers and manufacturers are constantly attempting to increase storage capacity for memory devices (e.g., increase storage per die or chip) while reducing associated costs. A postage-stamp-sized piece of silicon may contain tens of millions of transistors, each transistor as small as a few hundred nanometers. However, silicon-based devices are approaching their fundamental physical size limits.

Therefore, there is a need to overcome the aforementioned deficiencies associated with conventional systems.

SUMMARY OF THE INVENTION

The following presents a simplified summary of the invention in order to provide a basic understanding of one or more aspects of the invention. This summary is not an extensive overview of the invention. It is intended to neither identify key or critical elements of the invention, nor to delineate the scope of the present invention. Rather, the sole purpose of this summary is to present some concepts of the invention in a simplified form as a prelude to the more detailed description that is presented hereinafter.

The present invention provides for systems and methods of enabling a polymer memory cell to exhibit variable retention times for stored data therein. Such retention time can depend upon a programming mode and/or type of material employed in fabricating the polymer memory cell (e.g. in the passive or active layer.)

According to one aspect of the present invention, the polymer memory cell(s) can exhibit a short retention time for stored data, for example DRAM characteristics. The programming for such state can be achieved by subjecting the polymer memory cell to a low current. In another aspect, the short retention time for stored data can be obtained by subjecting the polymer memory cell to a low electric field (e.g. low voltage.) Similarly, the polymer memory cell can exhibit a long retention time, for example flash memory characteristics, by programming the memory cell via a high electric field and/or current. Other predetermined retention times can also be obtained by adjusting the electric field or current during programming. Accordingly, since such retention times can be a function of methodologies employed for programming the polymer memory cell, a wide selection of material can be employed for fabrication of memory cells.

In a related aspect of the present invention, the variable range of retention time can be obtained by tailoring material properties (e.g. for the superionic layer or passive layer) to obtain predetermined retention times. To obtain a short retention time for example, lithium or lithium ions can be employed as part of the passive layer. On the other hand, to obtain long retention times for example, copper or copper ions can be employed as part of the passive layer. As such, retention times can be a function of material employed, and dopings of various active or passive layers of polymer memory cell(s).

According to a further aspect of the present invention, such polymer memory cells with variable retention times can be integrated with standard silicon memory components (e.g. CMOS memory units), to provide for flexibility of circuit design. Various blocks of memory cells with short and/or long retention times can be fabricated side by side, such that functions of both D-RAMS and flash capabilities can be integrated or utilized in same memory device.

In a related aspect of the present invention, a multi and variable bit storage memory device can be fabricated, wherein DRAM and/or flash capabilities are exhibited depending in part on a user's need. Such dynamic mechanism can provide a trade off between density and operations time. Should a user require a high speed device number of bits per cell can be decreased, and thus storage density be optimized upon demand. For example, a 4 bit per cell memory mode can be employed transparently in a 3 bit or 2 bit or 1 bit per cell mode, depending on a user's need or decoding circuitry involved.

To the accomplishment of the foregoing and related ends, the invention, then, comprises the features hereinafter fully described. The following description and the annexed drawings set forth in detail certain illustrative aspects of the invention. However, these aspects are indicative of but a few of the various ways in which the principles of the invention may be employed. Other aspects, advantages and novel features of the invention will become apparent from the following detailed description of the invention when considered in conjunction with the drawings.

To facilitate the reading of the drawings, some of the drawings may not have been drawn to scale from one figure to another or within a given figure.

DETAILED DESCRIPTION OF THE INVENTION

Figure 1:
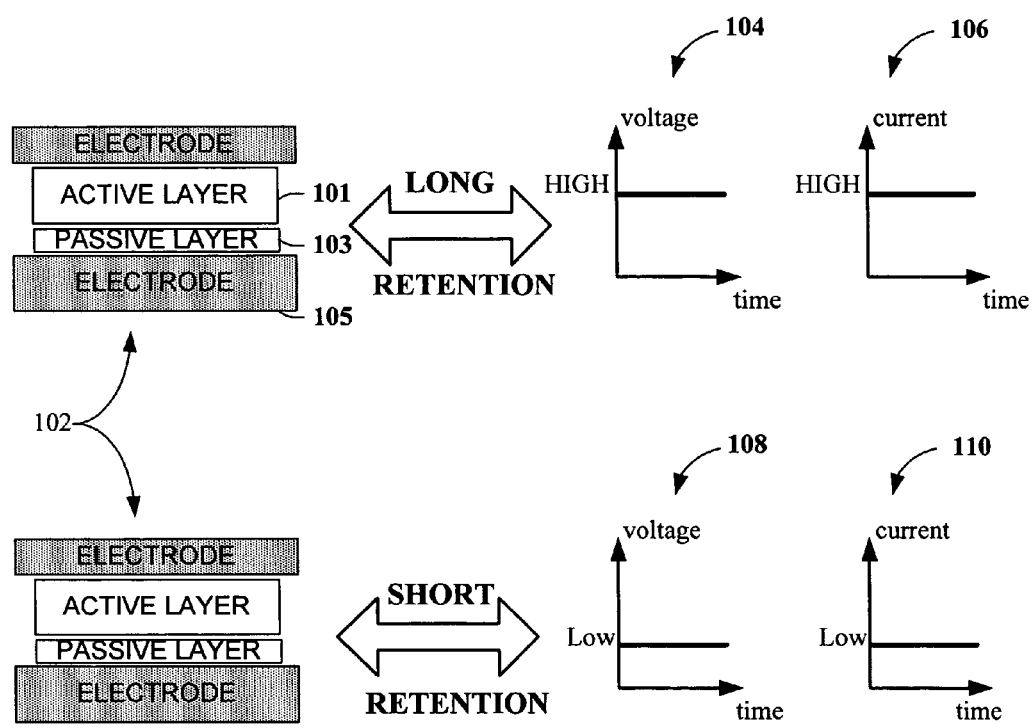
FIG. 1 illustrates a schematic diagram for programming polymer memory cells to obtain variable retention times for data stored therein in accordance with an aspect of the present invention.

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

The present invention provides for systems and methods of enabling a polymer memory cell to exhibit variable retention times for stored data, and to set a predetermined retention time for the memory cell. According to one aspect of the present invention retention time can depend upon a programming mode of the polymer memory cell. FIG. 1 illustrates a schematic diagram for such programming of a polymer memory cell(s) 102 to obtain variable retention times for data stored therein.

A long retention time can be obtained for memory cell 102 when such memory cell is programmed in accordance to at least one of the graphs 104 and 106, as discussed in more detail infra. Briefly, graph 104 illustrates subjecting the memory cell 102 to a high voltage during its programming. According to one particular aspect of the present invention the high voltage can be about 3 to 10 volts. Likewise, graph 106 illustrates subjecting the memory cell to a high current during a programming thereof, in order to induce long retention time characteristics into the polymer memory cell 102.

The polymer memory cell 102 can also be programmed such that it exhibits a low retention time feature for stored data. Such low retention feature can be induced by applying at least one of a low voltage and current as depicted by graphs 108 and 110 respectively. According to one particular aspect of the present invention the low voltage can be about 0.25–2 volts. Accordingly, retention times for the polymer memory cell 102 can be a function of methodologies employed for programming such polymer memory cell, and a wide selection of material, as discussed below, can be employed for fabrication of various passive (super-ionic) 103 and active layer 101.

As illustrated in FIG. 1, the active layer 101 and the passive layer 103 can be deposited over a conducting layer 105. The active layer 101 can change an impedance state (e.g., from a high resistance to a low resistance) when subject to a stimulus such as a voltage or current. An active molecule or molecular group forming the active layer can be one that changes a property when subjected to an electrical field and/or light radiation, (e.g., ionizable group); such as: nitro group, amino group, cyclopentadienyl, dithiolane, methlcyclopentadienyl, fulvalenediyl, indenyl, fluorenyl, cyclobis(paraquart-p-phenylene), bipyridinium, phenothiazine, diazapyrenium, benzonitrile, benzonate, benzamide, carbazole, dibenzothiophene, nitrobenzene, aminobenzenesulfonate, aminobenzoate, and molecular units with redox-active metals; metallocenes (Fe, V, Cr, Co, Ni and the like) complex, polypyridine metal complex (Ru, Os and the like).

In another aspect of the present invention, the active layer 101 can include polymers such as polyaniline, polythiophene, polypyrrole, polysilane, polystyrene, polyfuran, polyindole, polyazulene, polyphenylene, polypyridine, polybipyridine, polyphthalocyanine, polysexithiophene, poly(siliconoxohemiporphyrazine), poly(germaniumoxohemiporphyrazine), poly(ethylenedioxythiophene), polyfluorene, polyphenylacetylene, polydiphenylacetylene and related derivatives with active molecular group. It is to be appreciated that other suitable and related chemical compounds can also be employed including: aromatic hydrocarbons; organic molecules with donor and acceptor properties (N-Ethylcarbazole, tetrathiotetracene, tetrathiofulvalene, tetracyanoquinodimethane, tetracyanoethylene, cloranol, dinitro-n phenyl and so on); metallo-organic complexes (bisdiphenylglyoxime, bisorthophenylenediimine, tetraaza-tetramethylannulene and so on); porphyrin, phthalocyanine, hexadecafluoro phthalocyanine and their derivatives with active molecular group.

In a related aspect of the present invention, the active layer can comprise; polymer polyphenylacetylene+molecules of chloranil or tetracyano-quino-dimethane or dichlordicyanoquinone, copper phthalocyanine (which can be deposited by thermal deposition method to about 30 Å–1000 Å); copper hexadecafluoro phthalocyanine, amorphous carbon or palladium, (which can be deposited on the upper surface of the active layer by magnetron co-sputtering); and polysilanes with N-carbazolylpropyl group; polymer polytiophene with cyclopentadienyl groups; polysilanes with cyclopentadienyl groups; polysilanes with amino groups; polythiophene with alkyl amino groups; polythiophene with cyclopentadienyl alkyl groups; composite containing polydiphenylacetylene containing carbazolyl groups and dinitro-n-phenyl (DNP); polyethylenedioxythiophene and porous ferroelectric (polyvinyline fluoride) containing $LiCF_3$ $SO_3$ salt, polyethylenedioxythiophene and salt of potassium hexycyanoferrate. The active layer 101 can also comprise silver and/or hydrogen ions.

As depicted in FIG. 1, the active layer 101 can be formed over the passive layer 103 on top of a conductive layer 105, to fabricate layers of a polymer memory cell. The active layer 101 can be fabricated via a number of suitable techniques. One such technique involves growing the active layer 101 in the form of an organic layer from the passive layer 103. During such growth a quantity of material from conductive substrate can become incorporated into the active layer, for example in the form of metal ions (e.g., 2–12% copper concentrations) being chemically bound or trapped in the active layer 101. Likewise, chemical vapor deposition (CVD) techniques can also be employed. Typically, CVD can include low pressure chemical vapor deposition (LPCVD), atmospheric pressure CVD (APCVD), plasma enhanced chemical vapor deposition (PECVD), and high density chemical vapor deposition (HDCVD). For fabricating the active layer, other processes such as spin-on process, or sputtering process, or e-beam process, or thermal deposition process, or an ALD (Atomic Layer Deposition) can also be employed.

In a related aspect of the present invention, the active layer 101 can also be comprised of a conjugated organic material, such as a small organic molecule and a conjugated polymer. If the organic layer is polymer, a polymer backbone of the conjugated organic polymer may extend lengthwise between conducting layer 105 and a top conducting electrode (not shown) placed on the active layer after a treatment thereof with post treatment compound (e.g., generally substantially perpendicular to the inner, facing surfaces of the conducting layer 105). The conjugated organic molecule can be linear or branched such that the backbone retains its conjugated nature. Such conjugated molecules are characterized in that they have overlapping π orbitals and that they can assume two or more resonant structures. The conjugated nature of the conjugated organic materials facilitates control of properties associated with the memory cell fabricated from such layers. In this connection, the conjugated organic material of the active layer 101 has the ability to donate and accept charges (holes and/or electrons), and trap ions. Generally, the conjugated organic molecule has at least two relatively stable oxidation-reduction states. The two relatively stable states permit the conjugated organic polymer to donate and accept charges, when interacting with the passive (superionic) layer. Moreover when employing CVD techniques, it is not generally necessary to functionalize one or more ends of the organic molecule in order to attach it to the passive layer 103. Sometimes such organic molecules can have a chemical bond formed between the conjugated organic polymer of the active layer 101 and the passive layer 103.

In one particular aspect of the present invention, the organic material employed as part of the active layer can be cyclic or acyclic. For some cases, such as organic polymers, the organic material can self assemble during formation or deposition. Examples of conjugated organic polymers include one or more of polyacetylene (cis or trans); polyphenylacetylene (cis or trans); polydiphenylacetylene; polyaniline; poly(p-phenylene vinylene); polythiophene; polyporphyrins; porphyrinic macrocycles, thiol derivatized polyporphyrins; poly(p-phenylene)s; poly(imide)s; polymetallocenes such as polyferrocenes, polyphthalocyanines; polyvinylenes; polystiroles; and the like. Additionally, the properties of the organic material can be modified by doping with a suitable dopant.

Such organic material, which in one exemplary aspect can form the active layer 101, has a suitable thickness that depends upon the chosen implementations of the memory cell being fabricated. Some suitable exemplary ranges of thickness for the organic polymer layer, which in part can form the active layer 101, are about 10 nm or more and about 200 nm or less. Similarly, the passive layer 103 can have a suitable thickness that can vary based on the implementation of the memory cell being fabricated. Some examples of suitable thicknesses for the passive layer 103 can be: a thickness of about 5 nm or more and about 200 nm or less.

According to one aspect of the present invention, the passive layer can be selectively grown, spun-on, deposited upon the conducting layer 105 via CVD, vacuum thermal evaporation, sputtering, or plasma enhanced chemical vapor deposition (PECVD) utilizing a metal organic (MO) precursor. The deposition process can be monitored and controlled to facilitate, among other things, depositing the conductivity facilitating compound to a desired thickness.

Additionally, the passive layer 103 facilitates metal ion injection into the active layer 101 and increases the concentration of metal ions in the active layer 101 that can modify the conductivity of the active layer 101.

The passive layer 103 contains at least one conductivity facilitating compound that has the ability to donate and accept ions. Generally, the conductivity facilitating compound has at least two relatively stable oxidation-reduction states that can permit the conductivity facilitating compound to donate and accept ions. Examples of other conductivity facilitating compounds that can be employed for the passive layer 103 include one or more of the following: tungsten oxide ($WO_3$), molybdenum oxide ($MoO_3$), titanium selenide ($TiSe_2$), one or more of copper sulfide ($Cu_2S$, CuS), copper oxide (CuO, $Cu_2O$), manganese oxide ($MnO_2$), titanium dioxide ($TiO_2$), indium oxide ($I_3O_4$), silver sulfide ($Ag_2S$), iron oxide ($Fe_3O_4$), and the like. The passive layer 103 may be grown using oxidation techniques, formed via gas phase reactions, or deposited between conducting electrodes of a polymer memory cell. It is to be appreciated that the invention is not so limited and other conducting and/or semi conducting materials can also be employed. The passive layer 103 has a suitable thickness that can vary based on the implementation and/or memory device being fabricated. The passive layer 103 can in some instances act as a catalyst when forming the active layer 101. In this connection, a backbone of a conjugated organic molecule can initially form adjacent the passive layer 103, and grow or assemble away and substantially perpendicular to the passive layer surface. As a result, the backbones of the conjugated organic molecule can be self aligned in a direction that traverses the conducting layer 105 (e.g., copper electrode) The passive layer 103 can be formed by a deposition process (e.g., thermal deposition, PVD, non-selective CVD, and the like) or by a complete sulfidation of pre-deposited thin Cu layer.

Figure 2:
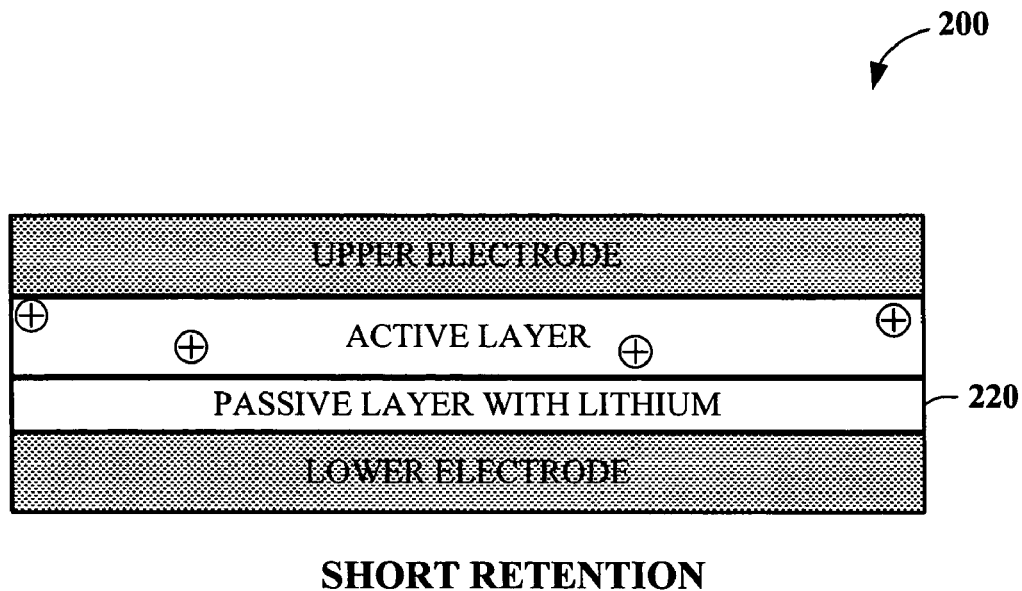
FIG. 2 illustrates a schematic diagram of polymer memory cells layers incorporating material that facilitate setting a desired or predetermined retention time according to one aspect of the present invention.
Figure 2:
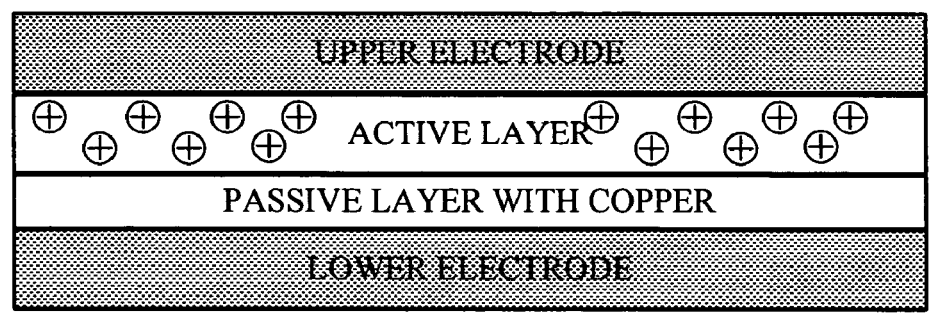

In another aspect of the present invention, various ranges of retention times can be obtained by tailoring material properties (e.g. for the superionic layer or passive layer). As illustrated in FIG. 2 for the polymer memory cell 200, to obtain a short retention time for example, lithium or lithium ions can be employed as part of the passive layer 220. Typically, employing lithium as part of the passive layer provides for fast switching and in general a low retention period for storing data within polymer memory cell.

On the other hand, to obtain long retention times for example, copper or copper ions can be employed as part of the passive layer. Desired retention times can be obtained as a function of material employed, and dopings of various active or passive layers of polymer memory cell(s). For example, by tailoring material in the active and passive layer, a memory cell can be fabricated to expire and self destruct after certain duration.

Figure 3:
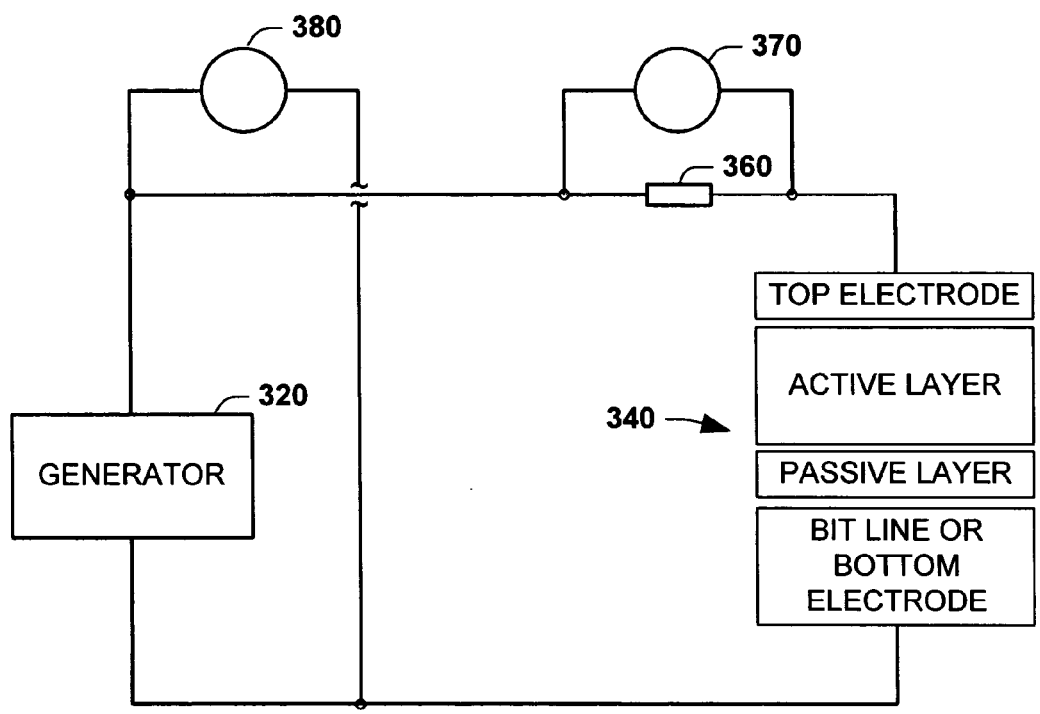
FIG. 3 illustrates a particular circuit for programming a polymer memory cell according to one aspect of the present invention.

Referring now to FIG. 3 a circuit that programs a memory cell 340 to exhibit variable retention times is illustrated. The control system for programming the memory cell 340 includes a generator 320 that can provide a controllable electrical current level (e.g. a programmable current) during information writing and/or recording of the memory cell 340. The memory cell 340 includes two electrodes that sandwich various passive and active layers therebetween. It is to be appreciated that the present invention is not so limited and other layers such as various barrier layers can also be employed.

A ballast resistor 360 is operatively connected to the memory cell 340, and has a resistance designed to limit the maximum current flowing through the memory cell 340. Registering devices 370 and 380 can monitor circuit conditions during various programming stages of the memory cell 340. For example, the value of the current flowing through the memory cell can be obtained by measuring voltage on the ballast resistor 360, and such registering device can include voltmeters, oscillographs, recorders and other devices employed for monitoring circuit conditions at any moment.

Figure 4:
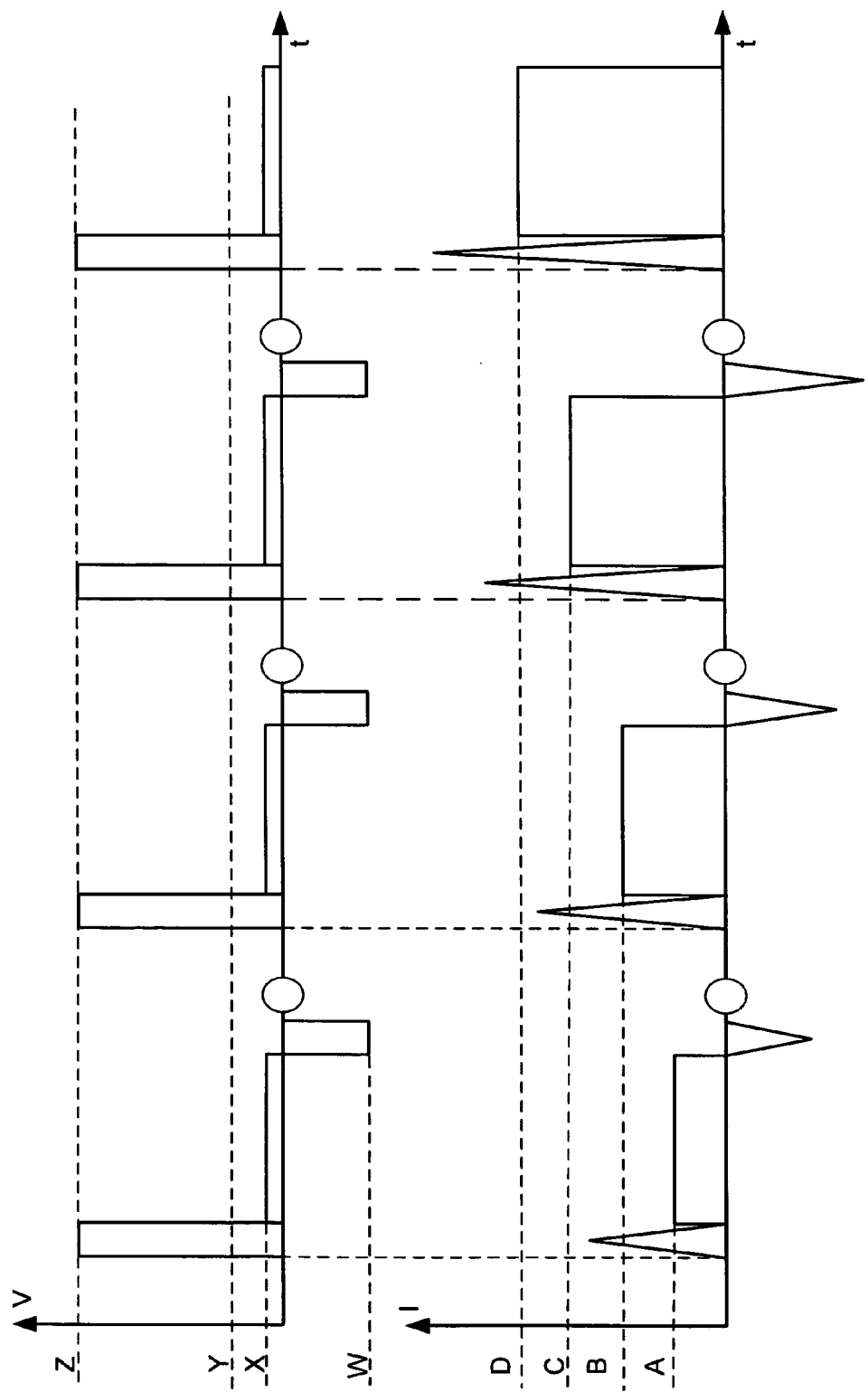
FIG. 4 illustrates graphs associated with voltage-time and current-time for various programming states of a memory cell according to one aspect of the present invention.

According to one particular methodology of the present invention, the generator 320 forms an initial voltage pulse that exceeds a threshold reference (e.g. voltage value) required for programming a memory cell. For example, FIG. 4 illustrates associated voltage-time and current-time graphs of such a methodology for writing a two bit memory cell operation. Voltage levels "Z" and "Y" depict an initial voltage pulse and a threshold voltage respectively. The values of the current flowing through the memory cell 340 can then be obtained by measuring voltage on the ballast resistor 360. As such, current flowing through the memory cell can be controlled such that the various electric current pulse states correspond to respective bits of information, written in to the memory cell. For example and as depicted in FIG. 4; electric current level "A" can designate a value "00", electric current level "B" can designate a value "01", electric current level "C" can designate a value "10", and electric current level "D" can designate the value "11", all which are programmable into the memory cell 340.

Next, and after the electric current pulse reaches the desired programmed state, the write programming is complete, and the programming voltage switched off. Similarly, to read bits of information from the memory cell 340, a reading voltage "X" that is lower than the threshold voltage value "Y" is generated via the generator 320. Based on the amount of current flowing through the ballast resistor 360 of FIG. 3 and the reading voltage "X", the resistance of the memory cell 340 can then be calculated. Such electric current can correspond to a reference electric current, as to verify a programmed state of the memory cell. Likewise, to erase information, the generator 320 creates a negative voltage pulse W, which can create a current, controlled to reach an erase threshold value flowing through the memory cell. It is to be appreciated that other properties besides voltage, current, or impedance can be employed to program a memory cell having a functioning zone. For example, the controlled value can be an intensity of light (optical programming when light sensor/emitter layers are employed), or amount of time that the memory cell is subject to an external stimulus and/or signal. Such can also depend upon the structure of a particular memory cell, and material employed in its fabrication, as for the particular memory structure illustrated by FIG. 3, it may be necessary to return the cell to its initial state and erase recorded information before a further write operation can be performed.

Figure 5A:
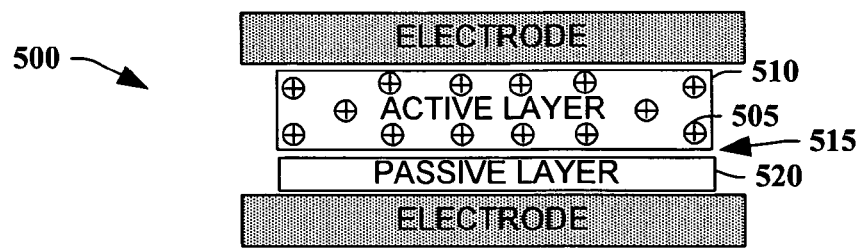
FIG. 5a–5c illustrate schematic diagrams for charge migration among passive and active layers of a memory cell in accordance with a particular aspect of the present invention.
Figure 5B:
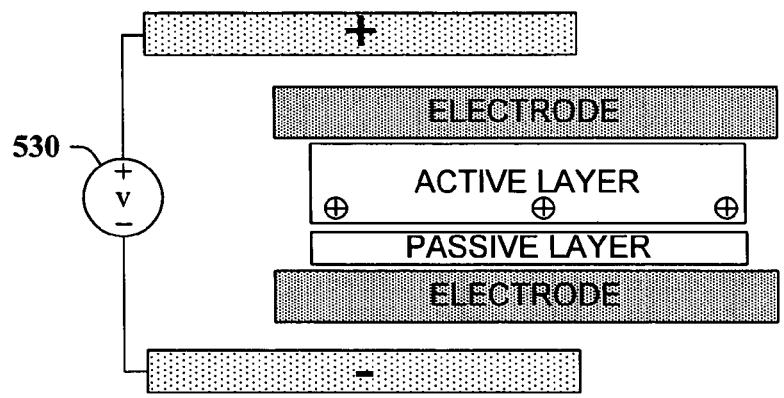
Figure 5C:
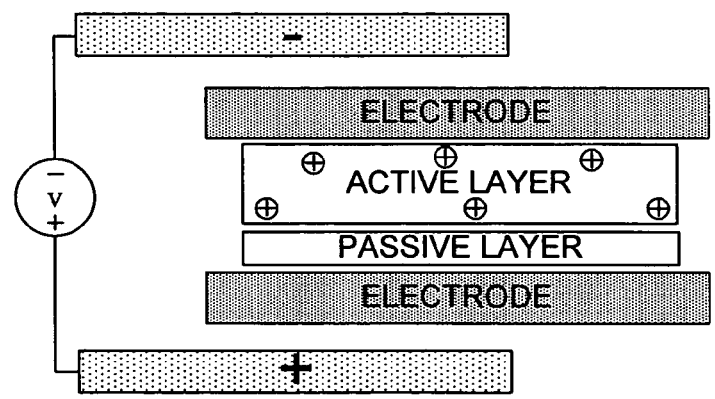

FIG. 5 illustrates a schematic of ion movement within the active layer 510 and the passive layer 520 to program for a long retention in accordance with an aspect of the present invention. Initially, and as depicted by FIG. 5(a) the polymer memory cell 500 can be subjected to an initialization process that facilitates a distribution of positive ions within the active layer 510. Next, and as depicted at FIG. 5(b), an electric field 530 (e.g. voltage) acts on the polymer memory cell 500, such that positive ions 505 can be substantially driven out of the active layer 510 towards an intersection 515 between the active layer 510 and into the passive layer 520. Subsequently, and as illustrated by FIG. 5(c) by reversing the electric field to a normal program voltage, some of the positive ions move back from the passive layer 520 into the active layer 510, such that there are enough ions in the active layer 510 to change a resistivity from a high resistance mode to a low resistance mode. Because of the high electric field typically required for such resistivity change, a substantially high number of metal ions can migrate in to the active layer 510. This can provide for programming (e.g. writing) the polymer memory cell at a very high mode. Thus, it can take a very long period for such migrated charge to dissipate, and thus long retention times can be obtained.

Figure 6:
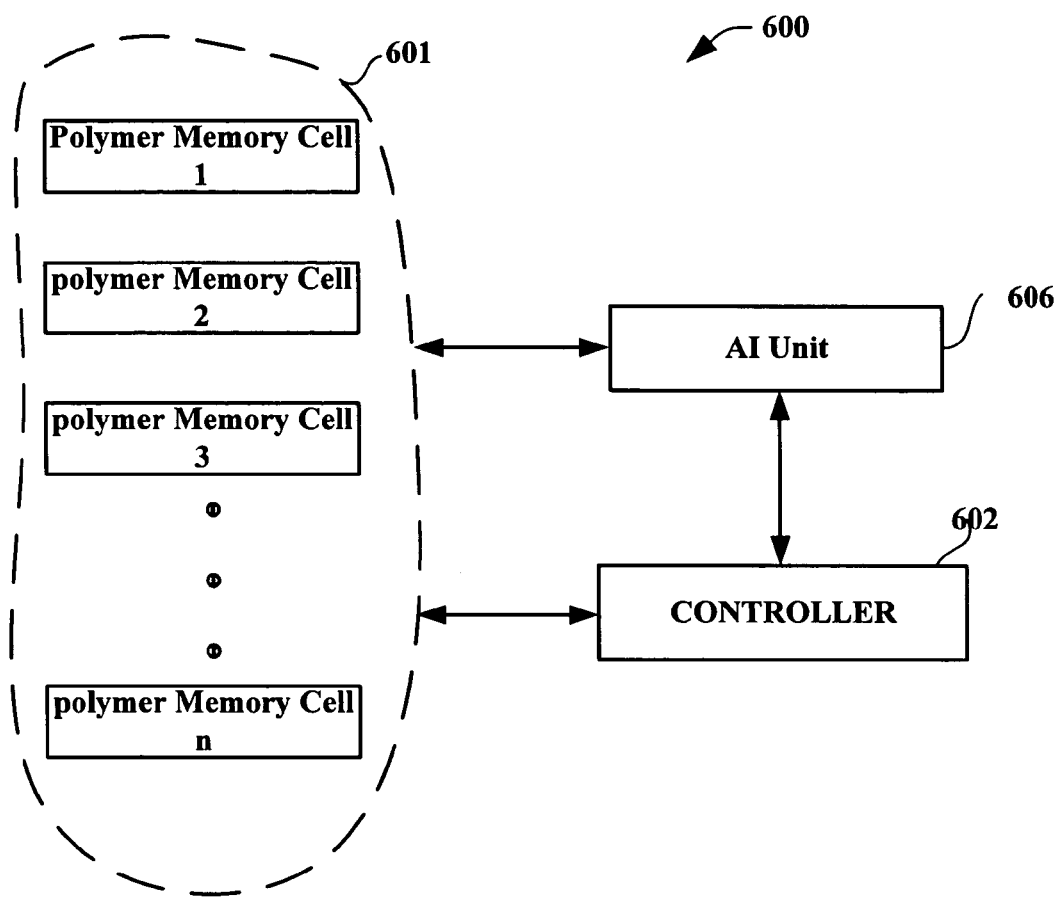
FIG. 6 illustrates a circuit employing an artificial intelligence unit for programming the memory cell with predetermined data retention time in accordance with an aspect of the present invention

Referring now to FIG. 6, a schematic block diagram illustrating a system 600 that actively programs a plurality of "n" memory cells 601, (n being an integer) each with a desired or predetermined retention time, according to one aspect of the present invention. The system includes a controller component 602 that can write/read/erase and program with a desired retention level, any of the memory cells operatively connected thereto by employing a controlled operation. Typically, each memory cell of the group can accept and maintain a plurality of states, in contrast to a conventional memory device that is limited to two states (e.g., off or on). Accordingly, each memory cell can employ varying degrees of conductivity to identify additional states. For example, the memory cells can have a very highly conductive state (very low impedance state), a highly conductive state (low impedance state), a conductive state (medium level impedance state), and a non-conductive state (high impedance state) thereby enabling the storage of multiple bits of information in a single memory cell, such as 2 or more bits of information or 4 or more bits of information (e.g., 4 states providing 2 bits of information, 8 states providing 3 bits of information and the like.) At the same time, each polymer memory cell can be set to (e.g. via programming and/or fabrication as described supra) to a exhibit a desired retention time for stored data.

As explained earlier, switching a memory cell of the group 601 to a particular state can be referred to as programming or writing. For example, programming can be accomplished by applying a particular voltage (e.g., 9 volts, 2 volts, 1 volt, and the like) across selected layers of the functioning zone of the memory cell, as described in detail supra. Such particular voltage, also referred to as a threshold voltage, can vary according to a respective desired state and is generally substantially greater than voltages employed during normal operation. Thus, there is typically a separate threshold voltage that corresponds to respective desired states (e.g., "off", "on" . . . ). The threshold value varies depending upon a number of factors including the identity of the materials that constitute the particular memory cell to be programmed, the thickness of the various layers, and the like.

As such, the presence of an external stimuli such as an applied, voltage or electric field that exceeds a threshold value (e.g. "on" state) permits the writing, reading, or erasing information into/from the memory cells 601; whereas the absence of the external stimuli that exceeds a threshold value ("off" state) prevents a write or erase of information into/from the memory cells 601.

To read information from the memory cells 601, a voltage or electric field (e.g., 2 volts, 1 volt, 0.5 volts) can be applied via the controller 602. Subsequently, an impedance measurement can be performed which, therein determines which operating state one or more of the memory cells are in (e.g., high impedance, very low impedance, low impedance, medium impedance, and the like). As stated supra, the impedance relates to, for example, "on" (e.g., 1) or "off" (e.g., 0) for a dual state device, or to "00", "01", "10", or "11" for a quad state device. It is appreciated that other numbers of states can provide other binary interpretations. To erase information written into the memory cells 601, a negative voltage or a polarity opposite the polarity of the writing signal that exceeds a threshold value can be applied. At the same time, such programming can induce various retention times for data stored in the polymer memory cell, as discussed supra.

The system 600 in connection with such programming can employ various artificial intelligence based schemes 606 for carrying out various aspects thereof. For example, a process for learning explicitly or implicitly when a particular memory device should be provided with a signal that initiates a desired retention time or a write, read, or erase, can be facilitated via an automatic classification system and process. In addition, tracing of an affected feature associated (e.g. current and/or voltage) with a particular memory cell can be accomplished via such artificial intelligence component 606. Classification can employ a probabilistic and/or statistical-based analysis (e.g., factoring into the analysis utilities and costs) to prognose or infer an action on a particular memory cell that is desired to be automatically performed. For example, a support vector machine (SVM) classifier can be employed. Other classification approaches include Bayesian networks, decision trees, and probabilistic classification models providing different patterns of independence can be employed. Classification as used herein also is inclusive of statistical regression that is utilized to develop models of priority. As will be readily appreciated from the subject specification, the subject invention can employ classifiers that are explicitly trained (e.g., via a generic training data) as well as implicitly trained (e.g., via receiving extrinsic information) so that the classifier is used to automatically determine according to a predetermined criteria what action to perform. For example, with respect to SVM's that are well understood, SVM's are configured via a learning or training phase within a classifier constructor and feature selection module. A classifier is a function that maps an input attribute vector, x=(x1, x2, x3, x4, xn), to a confidence that the input belongs to a class—that is, f(x)=confidence (class). As used in this application, the terms "component" and "system" are also intended to refer to a computer-related entity, either hardware, a combination of hardware and software, software, or software in execution. For example, a component can also be, but is not so limited, a process running on a processor, a processor, an object, an executable, a thread of execution, a program, and/or a computer. One or more components can reside within a process and/or thread of execution and a component can be localized on one computer and/or distributed between two or more computers.

Figure 7:
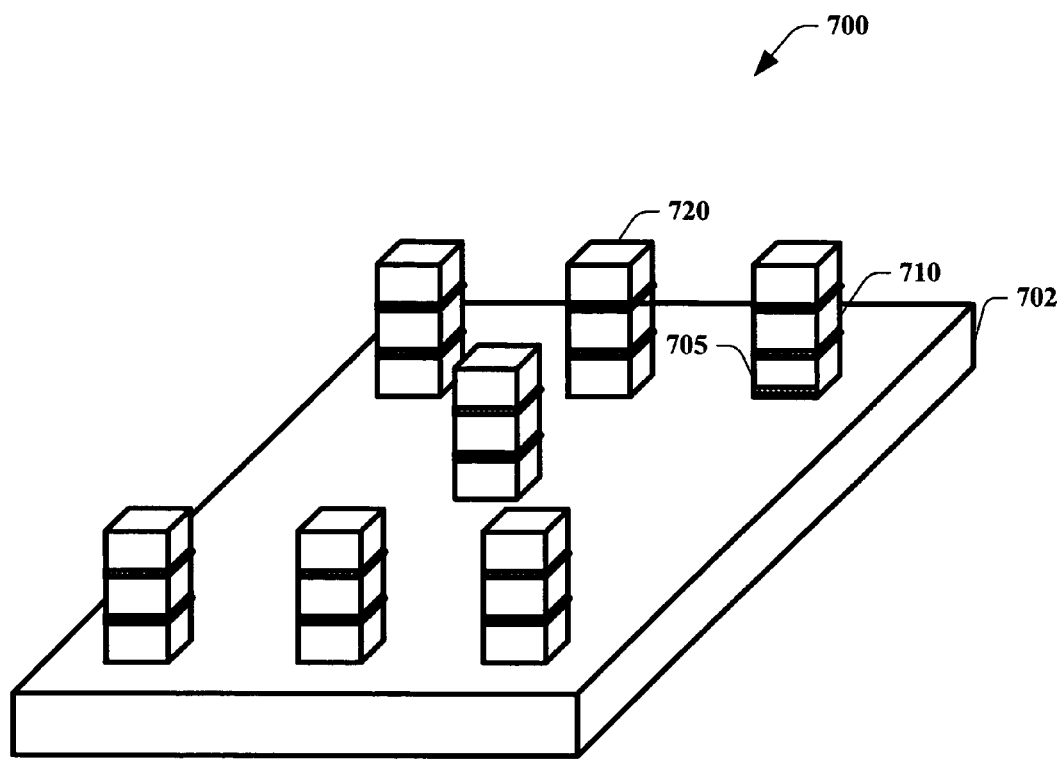
FIG. 7 is a schematic view of polymer memory stacks with various retention times integrated with conventional semiconducting memory elements, according to one aspect of the present invention.

The memory set 601 can be an array of polymer memory cells that is generally formed on a silicon based wafer, and includes a plurality of rows, referred to as bitlines, and a plurality of columns, referred to as wordlines. Such bit line and wordlines can be connected to the top and bottom metal layers of an individual memory cell's electrode. As illustrated in FIG. 7 such polymer memory cells with variable retention times can be integrated with standard silicon memory components (e.g. CMOS memory units), to provide for flexibility of circuit design. Various blocks of short and/or long retention polymer memory cells can be fabricated side by side or integrated with silicon device, such that functions of both D-RAMS and flash capabilities can be integrated or utilized in same memory device 700. For example, the stacked group 720 can comprise N number of polymer memory cells (N being an integer), programmable via control component (e.g. circuitry 705), which can be integrated with a conventional silicon memory component. Integrating polymer memory cells having variable retention times together with conventional semiconducting memory elements according to the present invention can increase flexibility of circuit design.

In a related aspect of the present invention, memory device 700 can be a multi and variable bit storage device, wherein DRAM and/or flash capabilities are exhibited depending in part on a user's need. Such dynamic mechanism can provide a trade off between density and operations time. Should a user require a high speed device number of bits per cell can be decreased, and thus storage density be optimized upon demand. For example, a 4 bit per cell memory mode can be employed transparently in a 3 bit or 2 bit or 1 bit per cell mode, depending on a user's need or decoding circuitry involved. A storage density of memory device 700 can also be optimized according to demand at a particular time, for example with a group of memory cells exhibiting DRAM capabilities, and a further group of memory cells exhibiting flash characteristics. A logic component (not shown) can regulate such dynamic mechanism in the memory device 700.

Figure 8:
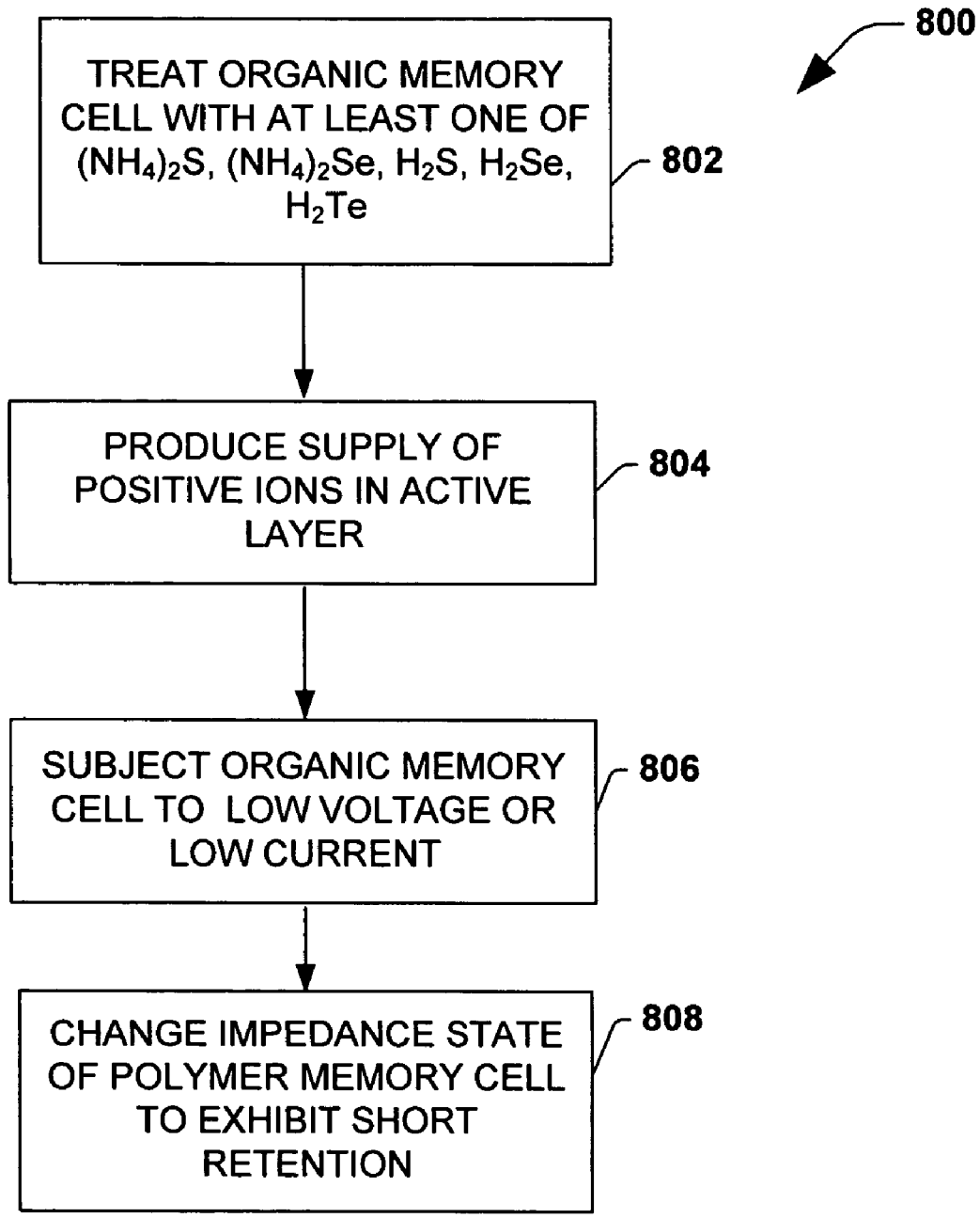
FIG. 8 illustrates an exemplary methodology for programming a memory cell in accordance with an aspect of the present invention.

Referring now to FIG. 8, a flow diagram illustrates a methodology 800 for programming a memory cell such that low retention features are exhibited according to one aspect of the present invention. The methodology begins at 802 wherein the polymer memory cell is subject to a post treatment with post treatment compounds such as $(NH_4)_2S$, $(NH_4)_2Se$, $H_2S$, $H_2Se$, $H_2Te$, which can react with active layer's metal particles to create the metal ions (or metal charged molecules) therein, at 804. Alternatively, an initialization procedure, as described supra can be employed to provide a typically uniform supply of positive ions within the active layer of the organic memory cell. Next and at 806, the memory cell to be programmed is subject to a low electrical field and/or electrical current. Such electrical field or current can be supplied via a control component and can change an impedance associated with the polymer memory cell to induce low retention capabilities in the polymer memory cell. The control component can further monitor/regulate the voltage and/or current, and thereby typically maintain it at a low level required for providing low retention for the polymer memory cell. Accordingly, short retention features at 808 can be exhibited for a polymer memory cell such programmed.

While the exemplary method is illustrated and described herein as a series of blocks representative of various events and/or acts, the present invention is not limited by the illustrated ordering of such blocks. For instance, some acts or events may occur in different orders and/or concurrently with other acts or events, apart from the ordering illustrated herein, in accordance with the invention. For example, the memory cell can be subject to a stimulus that facilitates reading bits of information, as opposed to writing or erasing. In addition, not all illustrated blocks, events or acts, may be required to implement a methodology in accordance with the present invention. Moreover, it will be appreciated that the exemplary method and other methods according to the invention may be implemented in association with programming the memory cell illustrated and described herein, as well as in association with other systems and apparatus not illustrated or described.

Figure 9:
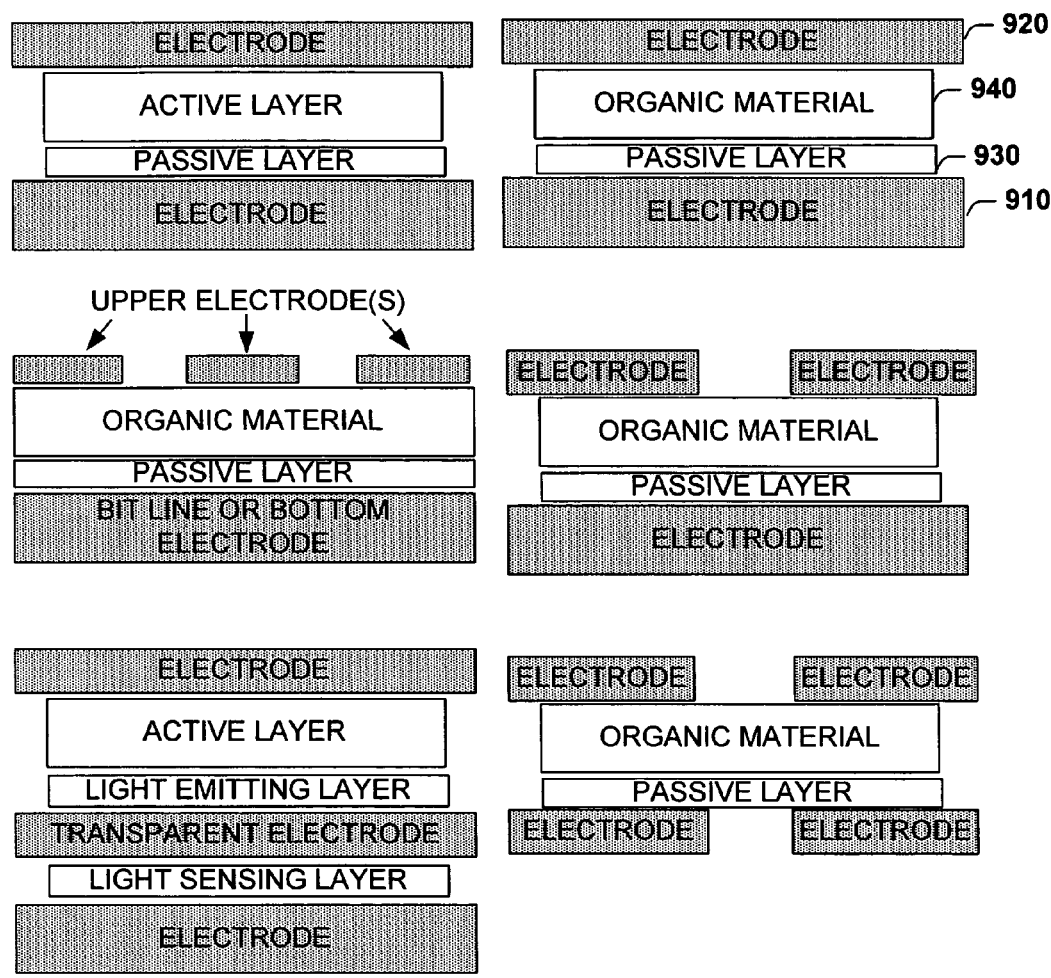
FIG. 9 illustrates various exemplary structures of memory devices treated in accordance with an aspect of the present invention.

Referring now to FIGS. 9 structures of memory cells with various exemplary electrode arrangements and passive/active layers that can be subject to a post treatment process are illustrated. Typically for such memory cells, upper and lower electrodes sandwich various other active and passive layers, and can be programmed and/or fabricated with material to exhibit desired retention times for data stored therein, as described in more detail supra. The electrodes (e.g. 910, 920) can be comprised of a conductive material such as, aluminum, chromium, copper, germanium, gold, magnesium, manganese, indium, iron, nickel, palladium, platinum, silver, titanium, zinc, alloys thereof, indium-tin oxide, polysilicon, doped amorphous silicon, metal silicides, and the like. Exemplary alloys that can be utilized for the conductive material include Hastelloy®, Kovar®, Invar, Monel®, Inconel®, brass, stainless steel, magnesium-silver alloy, and various other alloys.

The thickness of the electrodes can vary depending on the implementation and the memory device being constructed. However, some exemplary thickness ranges include about 100 nm or more and about 10 um or less for 910 and 920. The electrodes can be placed in an alternating fashion among various layers of for example semiconductor layers, polymer layers, and passive layers.

As explained supra, the passive layer 930 is operative to transport ions from electrode 910 to the interface between the active (e.g., organic) layer 940 and the passive layer 930. Additionally, the passive layer 930 facilitates ion injection into the active layer 940 and increases the concentration of the ions in the active layer resulting in a modification of the conductivity of the active layer 940. In addition, the passive layer 930 can in some instances act as a catalyst when forming the active layer 940. In this connection, backbone of the conjugated organic molecule may initially form adjacent the passive layer 930, and grow or assemble away and substantially perpendicular to the passive layer surface. As a result, the backbones of the conjugated organic molecule may be self aligned in a direction that traverses the two electrodes. The discussion infra describes and illustrates ionic concentration and models behavior of such organic memory devices.

In the following example, the active layer is conductive polymer with organic material, and $Cu_2S$ is used as passive layer material. It has relatively strong capability to gain electrons from a contacting polymer and yields the following equations:

$$Cu_2S \rightarrow Cu + Cu_{1.99}S, \text{ and } Cu \rightarrow Cu^+ + e^- \quad (1)$$

Figure 10:
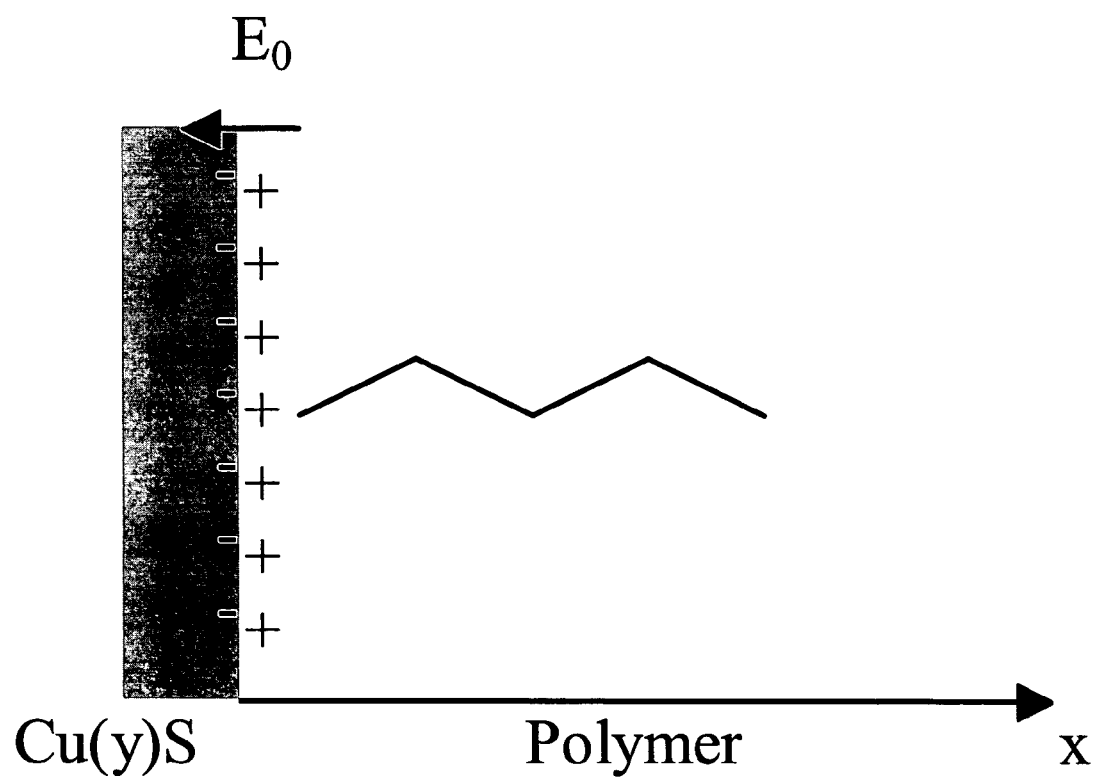
FIG. 10 is a graph depicting the effect of an intrinsic electric field on an interface between a passive layer and a polymer layer in accordance with an aspect of the present invention.

The consequence is that an intrinsic field is produced due to the charges accumulated on the interface between CuS and polymer. This is shown in FIG. 10, which is a graph depicting the effect of an intrinsic electric field on an interface between Cu(y)S (with y accepting a suitable value e.g., from 1 to 2) and a polymer is provided. The oxidized copper ($Cu^+$) is the charge carrier when external field is applied. The conductivity of polymer is determined by its concentration and its mobility.

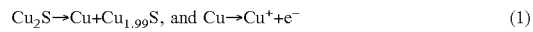

$$\sigma = q\, p\, \mu \quad (2)$$

Where q is the ionic charge, p is ion concentration and μ is the mobility.

Figure 11:
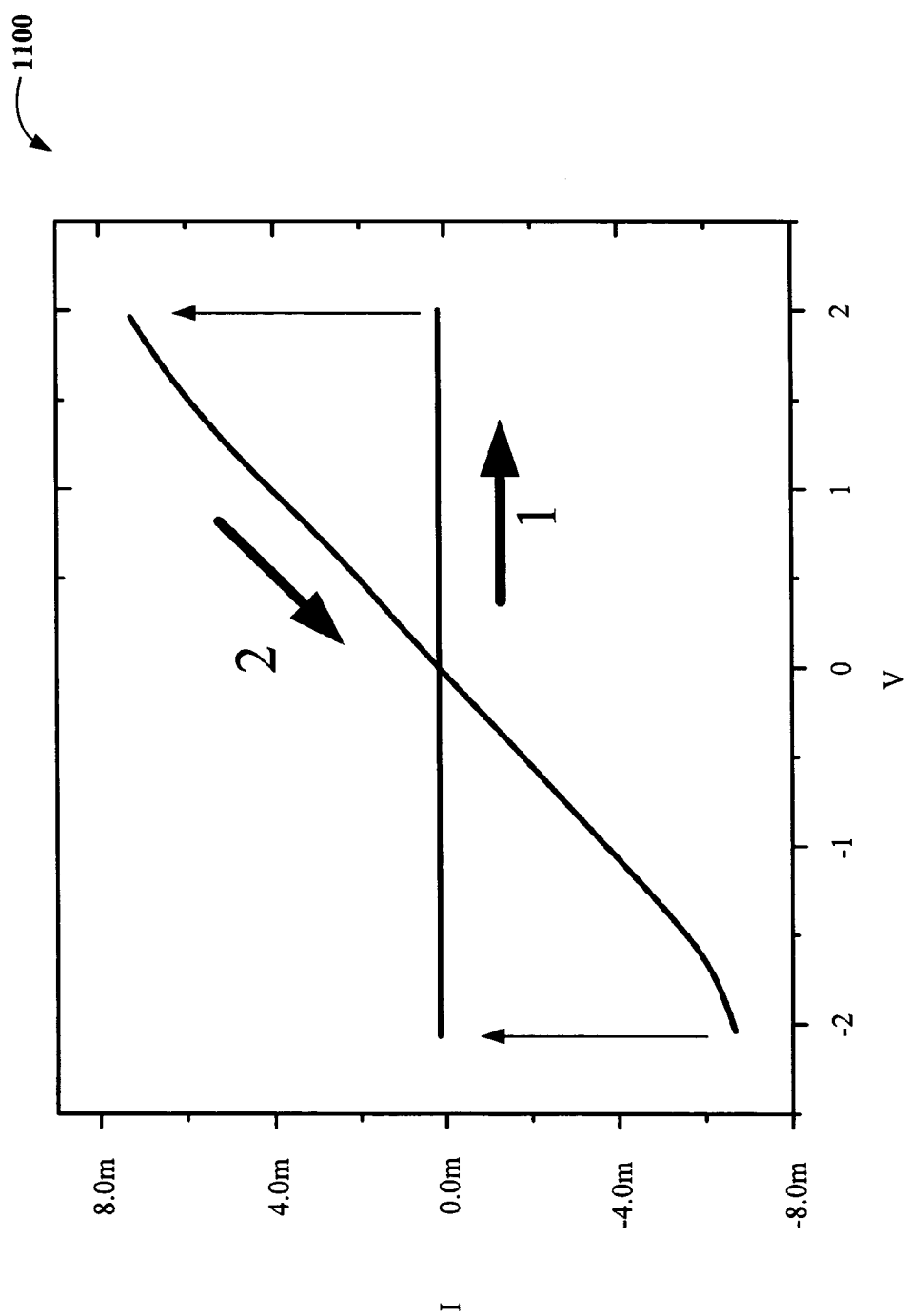
FIG. 11 is a graph illustrating I-V characteristics for an organic memory device in accordance with an aspect of the present invention.

Referring now to FIG. 11, an exemplary graph 1100 is illustrated showing I–V characteristics for a particular organic memory device of the present invention. As depicted, state 1, which indicates an "off" mode, the device can be modified to be in state 2, which indicates an "on" mode, by applying a positive voltage of 2V. Additionally, it can be seen that whilst in state 1, the organic memory device has a high impedance and low conductance. Subsequently, the organic memory device can be modified to change from state 2 to state 1 by application of a negative voltage therein, causing a reverse current until the state 1 is obtained. As explained in more detail supra, the manner the polymer memory cell is programmed (e.g. magnitude of applied voltages or currents) can affect data retention period associated with such polymer memory cells.

Such variable retention periods according to the present invention can be employed in a wide variety of industries, for example in down loading data (e.g. music) from servers and assigning pricing schemes as function of data retention times, security industry with self destructible memory units that expire at predetermined times, and the like.

Although the invention has been shown and described with respect to certain illustrated aspects, it will be appreciated that equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure, which performs the function in the herein illustrated exemplary aspects of the invention. In this regard, it will also be recognized that the invention includes a system as well as a computer-readable medium having computer-executable instructions for performing the acts and/or events of the various methods of the invention.

What is claimed is:

1. A memory device comprising;
   a plurality of polymer memory cells with polymer memory cell comprising;
   an active layer that changes an impedance state based on a migration of charges therefrom,
   a passive layer that facilitates supply of charges to the active layer, and
   a variable retention time is provided by transferring charges between the active layer and the passive layer, wherein the variable retention time is set by adjusting at least one of an external electric field and an electric current during programming of the polmer memory cell,
   a group of polymer memory cells that exhibit DRAM retention capabilities, and
   a further group of polymer memory cells that exhibit flash retention capabilities, the
   group of polymer memory cells that exhibit DRAM retention capabilities and the further group
   of polymer memory cells that exhibit flash retention capabilities are integrated together into the
   memory device and are dynamically varied based upon a user's need.

2. A polymer memory cell comprising;
   an active layer that changes an impedance state based on a migration of charges therefrom when subject to at least one of an external electric field and an electric current, and
   a passive layer that facilitates supply of charges to the active layer, the passive layer and the active layer transfer charges therebetween to provide a variable retention time for data stored in the polymer memory cell, the variable retention time is set by adjusting the at least one of the external electric field and the electric current during programming of the polymer memory cell.

3. The polymer memory cell of claim 2, the variable retention time varies based on a manner the polymer memory cell is programmed.

4. The polymer memory cell of claim 3, the manner the memory cell is programmed comprises placement the polymer memory cell in an electric field.

5. The memory device of claim 1, the passive and active layer exhibit a DRAM characteristic retention time.

6. The memory device of claim 1, the passive and active layer exhibit flash characteristic retention time.

7. The memory device of claim 1, the active layer comprises molecular units with redox-active metals.

8. The memory device of claim 7, the redox active metals comprise at least one of: metallocenes complex and polypyridine metal complex.

9. The polymer memory cell of claim 2, the variable retention time varies based on type of material employed in the active layer or the passive layer.

10. The polymer memory cell of claim 9, the active layer comprises copper ions.

11. The polymer memory cell of claim 9, the active layer comprises at least one of silver, lithium, and hydrogen ions.

12. The memory device of claim 9, the active layer comprises at least one of;
    polyaniline, polythiophene, polypyrrole, polysilane, polystyrene, polyfuran, polyindole polyazulene, polyphenylene, polypyridine, polybipyridine, polyphthalocyanine, polysexithiofene, poly(siliconoxohemiporphyrazine), poly(germaniumoxohemiporphyrazine), and poly(ethylenedioxythiophene).

13. The memory device of claim 9, the active layer comprises material selected from the group comprising of electric dipole elements, polymer ferroelectrics clusters, non-organic ferro-electrics, salts, alkalis, acids, and water molecules.

14. The memory device of claim 9, the active layer is formed via at least one of a CYD, spin-on process, sputtering process, e-beam process, thermal deposition process, and an ALD process.

15. The memory device of claim 9, the active layer comprises at least one of;
    hydrocarbons; organic molecules with donor and acceptor properties, metallo-organic complexes; porphyrin, phthalocyanine, and hexadecafluoro phthalocyanine.

16. The memory device of claim 15, the metallo-organic complexes are selected from the group of bisdiphenylglyoxime, bisorthophenylenediimine, and tetraaza-tetramethylannulene.

17. The memory device of claim 15, the organic molecules with donor acceptor properties comprises at least one of: N-Lthylcarbazole, tetrathiotetracene, tetrathiofulvalene, tetracyanoquinodimethane, tetracyanoethylene, cloranol, and dinitro-n phenyl.

18. The memory device of claim 17, the active layer comprises organic material selected from the group comprising of polyacetylene, polyphenylacetylene, polydiphenylacetylene, polyaniline, poly(p-phenylene vinylene), polythiophene, polyporphyrins, porphyrinic macrocycles, thiol derivatized polyporphyrins, polymetallocenes, polyferrocenes, polyphthalocyanines, polyvinylenes, and polystiroles.

* * * * *